United States Patent
Pomerene et al.

(10) Patent No.: US 6,645,786 B2
(45) Date of Patent: Nov. 11, 2003

(54) INTEGRATED CIRCUIT DEVICE HAVING A BUILT-IN THERMOELECTRIC COOLING MECHANISM

(75) Inventors: Andrew T. S. Pomerene, Leesburg, VA (US); Thomas J. McIntyre, Nokesville, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 10/374,115

(22) Filed: Feb. 24, 2003

(65) Prior Publication Data

US 2003/0129783 A1 Jul. 10, 2003

Related U.S. Application Data

(62) Division of application No. 09/692,992, filed on Oct. 20, 2000, now Pat. No. 6,559,538.

(51) Int. Cl.[7] .............................................. H01L 21/00
(52) U.S. Cl. ........................................................ 438/54
(58) Field of Search ............................................ 438/54

(56) References Cited

U.S. PATENT DOCUMENTS

| | | | |
|---|---|---|---|
| 4,402,185 A | 9/1983 | Perchak | |
| 5,079,618 A | 1/1992 | Farnworth | |
| 5,203,731 A | 4/1993 | Zimmerman | |
| 5,229,327 A | 7/1993 | Farnworth | |
| 5,722,249 A | 3/1998 | Miller, Jr. | |
| 5,956,569 A | * 9/1999 | Shiu et al. | 438/48 |
| 6,094,919 A | 8/2000 | Bhatia | |
| 2002/0113289 A1 | * 8/2002 | Cordes et al. | 257/528 |

* cited by examiner

Primary Examiner—Richard Elms
Assistant Examiner—Beth E. Owens
(74) Attorney, Agent, or Firm—Daniel J. Long; Antony P. Ng; Bracewell & Patterson, L.L.P.

(57) ABSTRACT

A method for manufacturing a thermoelectric cooling mechanism for an integrated circuit is disclosed. Initially, electric circuits are formed on one side of a wafer. Subsequently, thermoelectric cooling devices are formed on an opposite side of the same wafer. Specifically, the thermoelectric cooling devices are formed by depositing a first conductive layer, depositing a layer of Peltier material on top of the first conductive layer, building a set of $N^{30}$ regions and $P^{30}$ regions within the Peltier material layer, and depositing a second conductive layer on top of the Peltier material layer.

8 Claims, 6 Drawing Sheets

INTEGRATED CIRCUIT DEVICE HAVING A BUILT-IN THERMOELECTRIC COOLING MECHANISM

The present application is a divisional of application Ser. No. 09/692,992 filed Oct. 20, 2000, now U.S. Pat. No. 6,559,538, issued May 6, 2003.

BACKGROUND OF THE INVENTION

1. Technical Field

The present invention relates to cooling mechanism in general, and in particular to a thermoelectric cooling mechanism. Still more particularly, the present invention relates to an integrated circuit device having a built-in thermoelectric cooling mechanism.

2. Description of the Prior Art

The fact that integrated circuit (IC) devices can operate faster at sub-ambient temperature is well-known in the art. For example, the performance of an IC device improves by 50% when operated at −50° C. instead of ambient room temperature, and a 200% speed improvement can be achieved by cooling the IC device with liquid nitrogen at −196° C. Similar performance improvements have also been observed on interconnects within the IC device. For example, interconnect resistance decreases by a factor of two when the IC device is operated at −50° C. rather than at ambient room temperature. Thus, IC device performance can be significantly benefited by sub-ambient temperature, which begs the question of how to cool IC devices to a sub-ambient temperature in an efficient and cost effective manner.

Conventionally, sub-ambient cooling is accomplished through gas/liquid vapor compression-based cooling systems, using Freon-type refrigerants to provide heat transfer. Although vapor compression-based cooling can be quite efficient, a significant amount of hardware, such as a compressor, a condenser, an evaporator, and related coolant transfer plumbing, is required. As a result, vapor compression-based cooling has not found general acceptance for cooling small objects such as IC devices.

A more promising method for cooling IC devices is thermoelectric cooling. In addition to being compact, thermoelectric devices such as Peltier devices are also very reliable because they typically have no associated moving parts. The present disclosure provides an improved thermoelectric cooling mechanism for cooling IC devices.

SUMMARY OF THE INVENTION

In accordance with a preferred embodiment of the present invention, electric circuits are formed on one side of a wafer. Subsequently, multiple thermoelectric cooling devices are formed on another side of the wafer.

All objects, features, and advantages of the present invention will become apparent in the following detailed written description.

DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
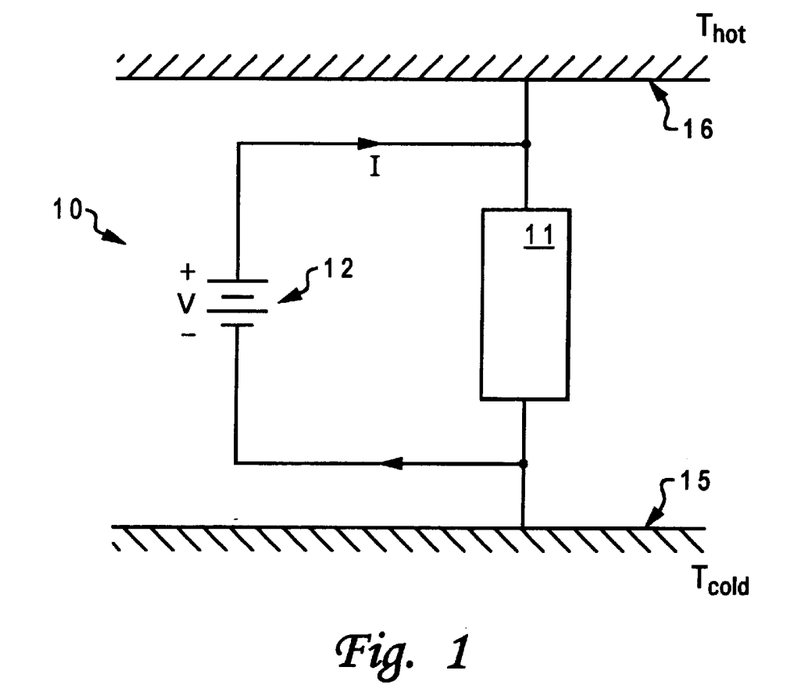
FIG. 1 is a pictorial representation of a Peltier type thermoelectric cooling system.

Referring now to the drawings and in particular to FIG. 1, there is depicted a pictorial representation of a Peltier type thermoelectric cooling system 10 having a Peltier device 11. Peltier device 11 is typically fabricated from Peltier materials such as bismuth telluride ($Bi_2Te_3$) or lead telluride (PbTe). In contrast to most metals that typically exhibit both high electrical and high thermal conductivity, Peltier materials exhibit very high electrical conductivity and relatively low thermal conductivity. As shown, Peltier device 11 is connected to a DC power supply 12 that provides an electric field V and a current I across Peltier device 11. During operation, Peltier device 11 transports electrons from a cold sink 15 to a hot sink 16, in response to the electric field placed across Peltier device 11. The desired heat transfer is from cold sink 15 at temperature $T_{cold}$ to hot sink 16 at temperature $T_{hot}$.

Figure 2A:
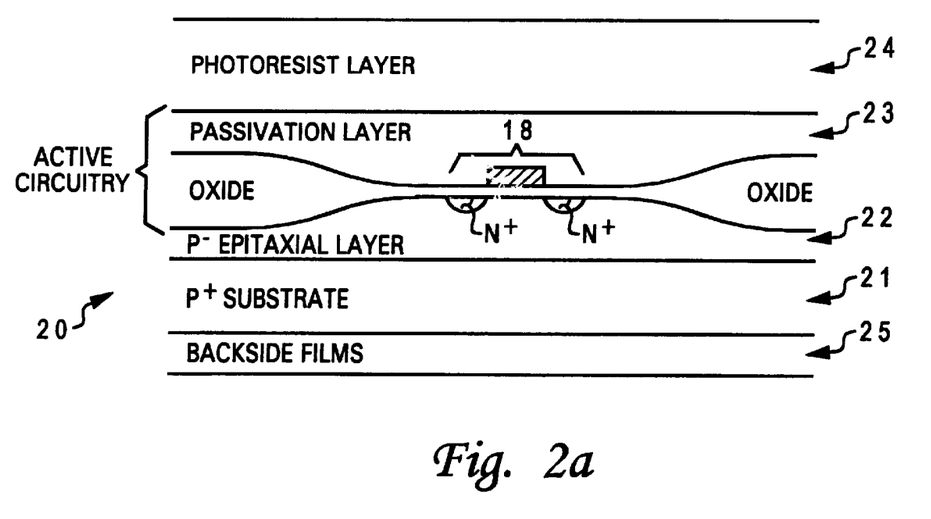
FIGS. 2a–2i are pictorial representations of a process for making an integrated circuit device having a build-in thermoelectric cooling mechanism in accordance with a preferred embodiment of the present invention.

In accordance with a preferred embodiment of the present invention, thermoelectric cooling mechanism 10 is incorporated within a semiconductor substrate on which active electric circuitry is built. Thermoelectric cooling mechanism 10, in a form of a Peltier device as shown in FIG. 1, is built on a semiconductor substrate as follows. First, active electric circuitry is constructed on a wafer according to a specific design. The electric circuitry can be constructed on the wafer by a set of standard fabrication steps as they are well-known in the art, up to a contact level. A protective surface, such as a thick photoresist film, is then put on top of the electric circuitry to provide mechanical protection for the electric circuitry. At this point, the wafer should resemble wafer 20 as depicted in FIG. 2a. As shown, wafer 20 includes a P+ substrate 21, an P− epitaxial layer 22, a passivation layer 23, and a photoresist layer 24. Passivation layer 23 is where active circuitry resided. Active circuitry includes many transistors that resemble transistor 18 having a polysilicon gate and two diffusion regions. Wafer 20 also includes backside films 25 located at the backside of P+ substrate 21. Backside films 25 preferably include a combination of polysilicon film, oxide film, and nitride film.

Wafer 20 is then turned over, and a reactive ion etching (RIE) process is performed to remove backside films 25 from the backside of substrate 21. Subsequently, the backside of substrate 21 is mechanically polished to reduce the thickness of substrate 21. The thickness reduction of substrate 21 allows a would-be built Peltier device to be closer to the active circuitry on the front side of substrate 21.

Figure 2B:
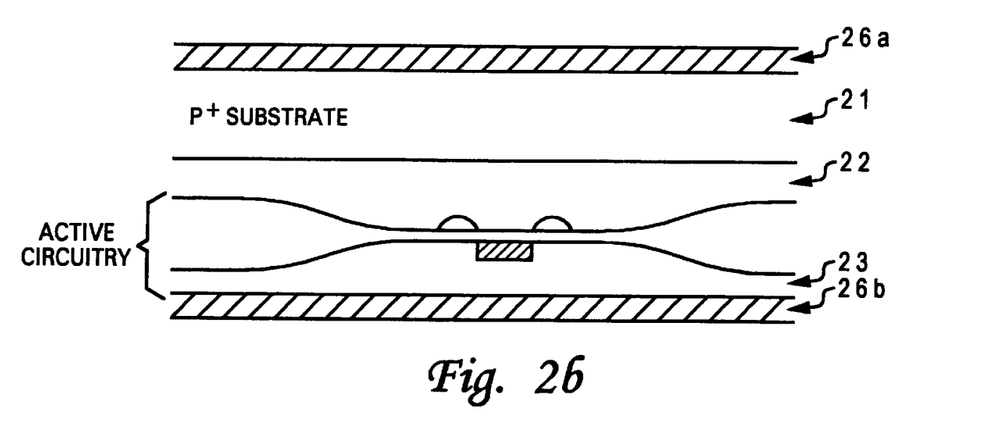

After removing photoresist layer 24, a barrier layer 26a is deposited on the backside of substrate 21, as illustrated in FIG. 2b. Barrier layer 26a can be a nitride or a diamond-like carbon that is a good electrical insulator and an excellent thermal conductor. Barrier layer 26a prevents contamination from Peltier components and also electrically isolates Peltier device from the active circuitry on the front side of substrate 21. A barrier layer 26b (identical to barrier layer 26a) is also deposited on the surface of passivation layer 23 to provide mechanical protection for passivation layer 13 in which active circuitry is resided.

Figure 2C:
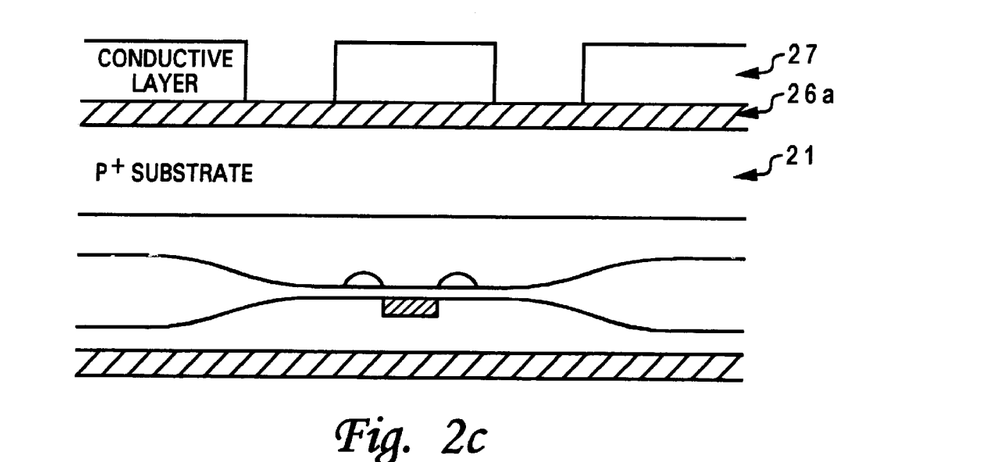

Next, a conductive layer 27 is placed on top of barrier layer 26a. Conductive layer 27 can be made of copper or doped polysilicon. Conductive layer 27 is then lithographically patterned and etched using barrier layer 26a as etch stop. The patterning and etching can be performed with a photoresist along with an appropriate mask as they are well-known in the art. The result is shown in FIG. 2c.

Figure 2D:
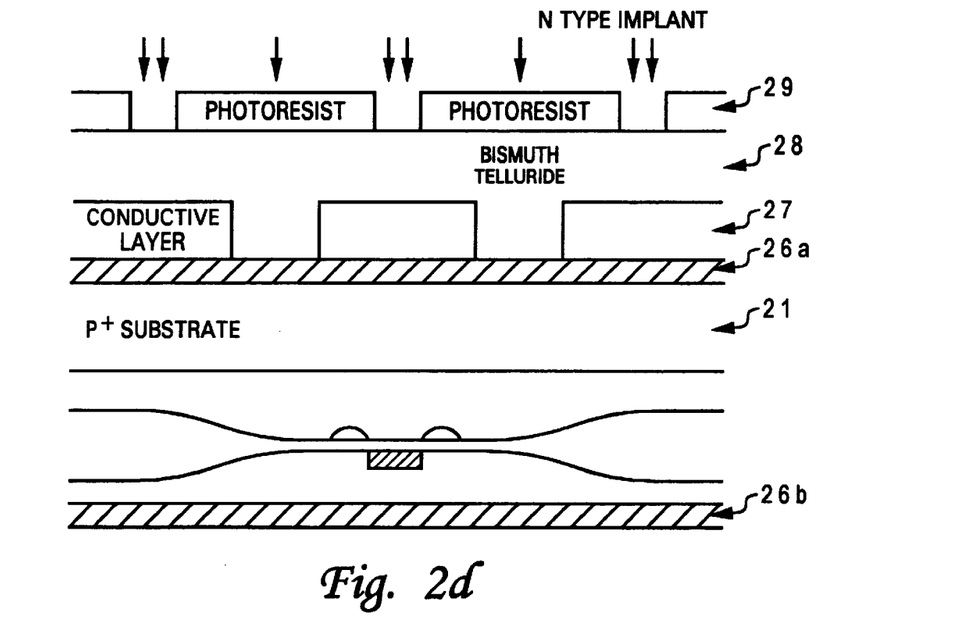

A bismuth telluride (or similar material such as lead telluride or chalcogenide) layer 28 is deposited on top of conductive layer 27. After bismuth telluride layer 23 has been lithographically patterned with a photoresist layer 29, ion implantations are performed to construct regions of $N^{30}$ type material, as depicted in FIG. 2d. The $N^{30}$ ion implantations using, for example, phosphorus, are preferably performed in multiple steps to achieve a continuous gradient needed through bismuth telluride layer 23, as follows:

step 1: a dose of 1.4 $E^{19}$/cm$^2$ with an energy of 900 KeV;

step 2: a dose of 4.4 $E^{19}$/cm$^2$ with an energy of 375 KeV; and step 3: a dose of 3.2 $E^{19}$/cm$^2$ with an energy of 175 KeV.

Figure 2E:
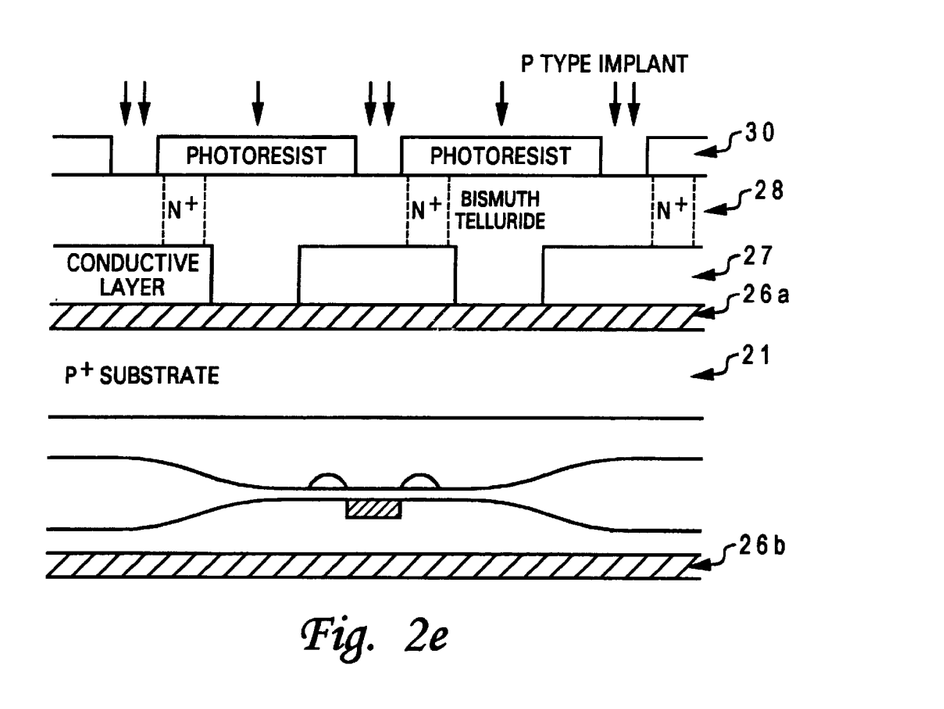

After removing photoresist layer 29, bismuth telluride layer 28 is then lithographically patterned with a photoresist layer 30. Ion implantations are subsequently performed to construct regions of $P^{30}$ type material, as depicted in FIG. 2e. The $P^{30}$ ion implantations using, for example, boron, are preferably performed in multiple steps to achieve a continuous gradient needed through bismuth telluride layer 23, as follows:

step 1: a dose of 1.5 $E^{19}$/cm$^2$ with an energy of 450 KeV;

step 2: a dose of 4.2 $E^{19}$/cm$^2$ with an energy of 190 KeV; and step 3: a dose of 3.0 $E^{19}$/cm$^2$ with an energy of 75 KeV.

Figure 2F:
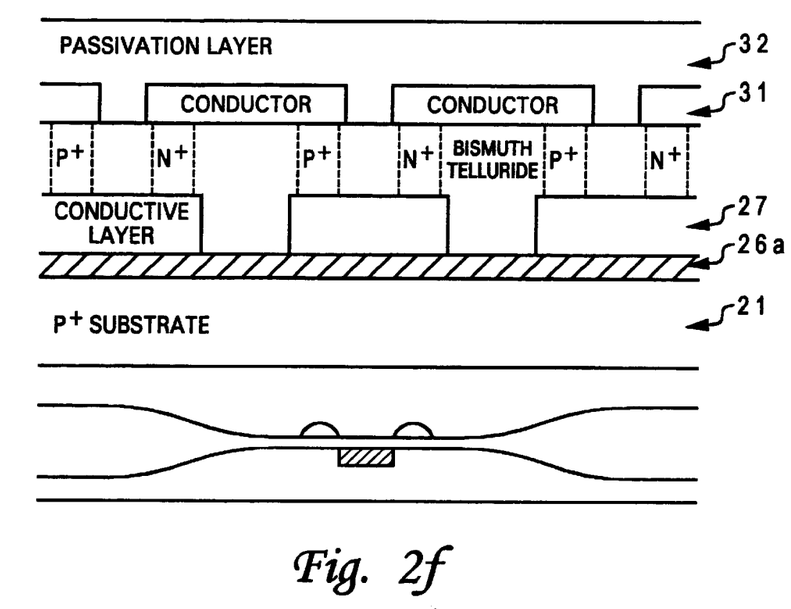

The separate $N^+$ regions and $P^+$ regions line up with the previously patterned conductors in conductor layer 27 to form an alternating $N^+$ and $P^+$ type regions of a Peltier device, as illustrated in FIG. 2f.

After removing photoresist 30, a conductive layer 31 is deposited over bismuth telluride layer 28. Conductor layer 31 subsequently patterned to line up with the $N^{30}$ regions and $P^{30}$ regions within bismuth telluride layer 28. A passivation layer 32, such as plasma oxide, is then deposited over conductive layer 31, and a rapid thermal annealing is performed to relieve any stress in passivation layer 32 and to activate the implants. Next, barrier layer 26b is then removed from the front side of wafer 10. At this point, the processing for the front side of wafer 10 is completed. The result is shown in FIG. 2f.

Figure 2G:
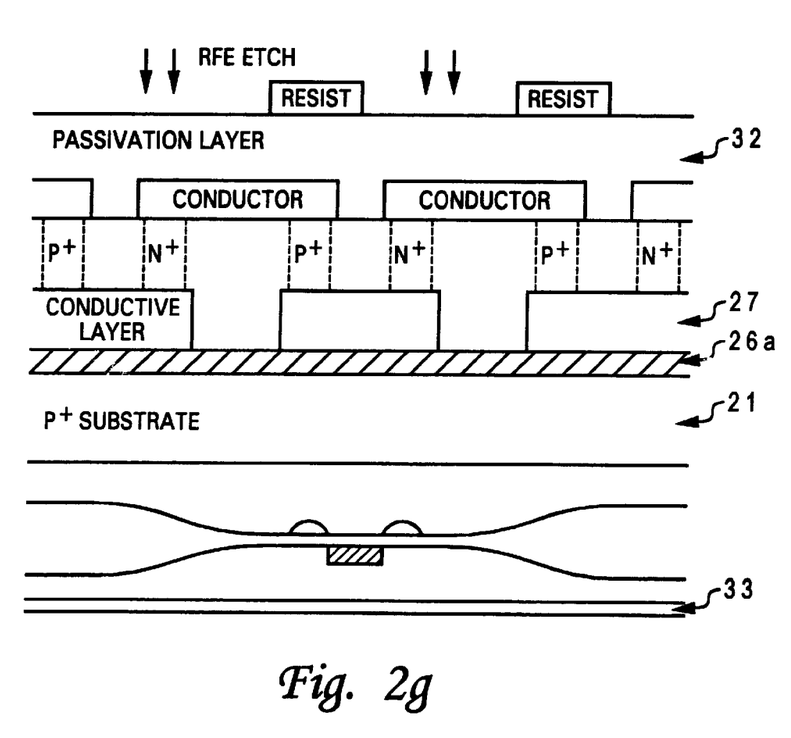
Figure 2H:
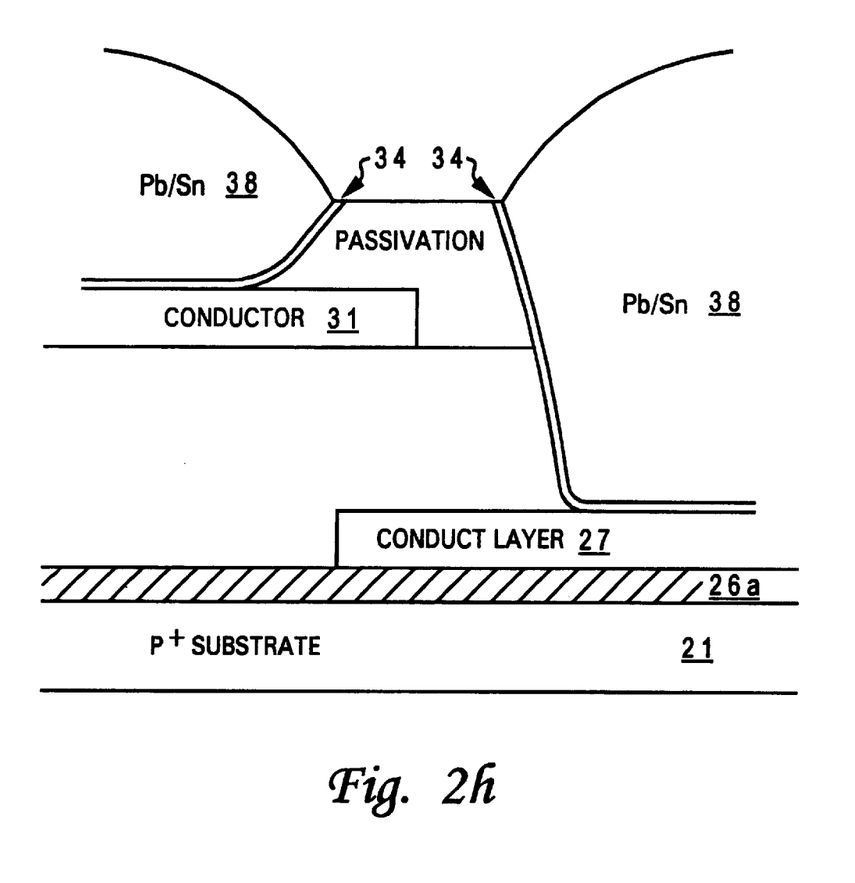

Afterwards, passivation layer 32 is then patterned and etched to form vias for allowing conductive layer 31 and conductive layer 27 of the Peltier devices to be electrically connected to a current source, as depicted in FIG. 2g. This can be accomplished by using a moly mask to deposit a chrome/copper/gold film 34 and then depositing lead/tin balls 38 for ball bonding to a package, as shown in FIG. 2h. Alternatively, a laser could be used to drill a hole down to conductive layers 31 and 27 of the Peltier devices, and conductive layers 31 and 27 can then be wired from the front side of wafer 10.

Figure 2I:
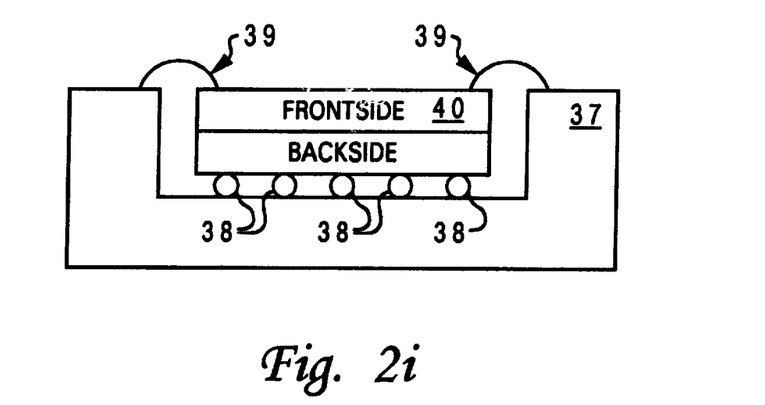

As shown in FIG. 2i, an integrated circuit 40 from wafer 10 is now complete with active electric circuitry on the front side and Peltier devices on the backside. Electric circuitry is connected to a chip package 37 via bond wires 39. Peltier devices provide active heat dissipation into chip package 37 via ball bonds 38.

Figure 3:
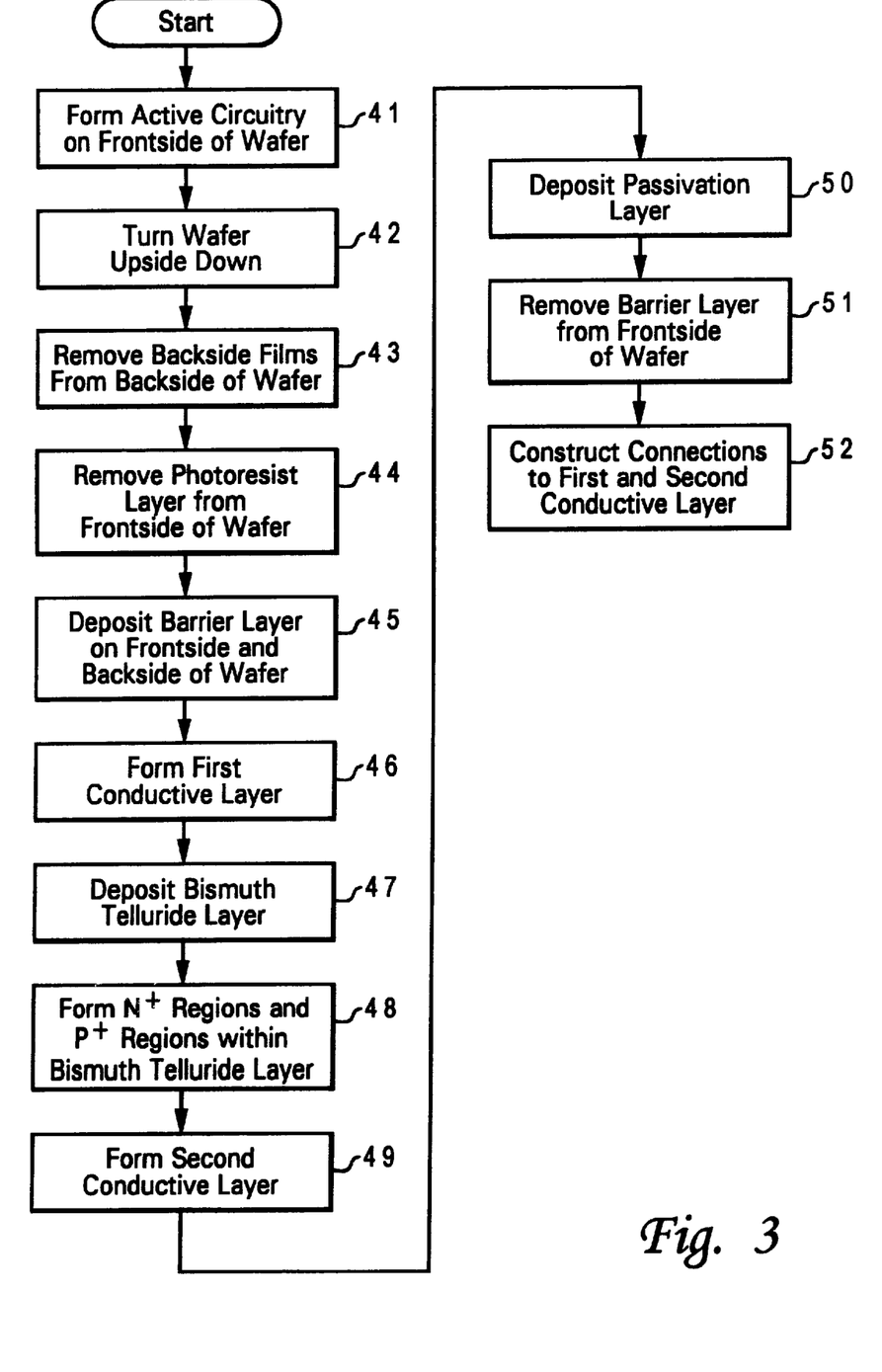
FIG. 3 is a high-level process flow diagram of a method for manufacturing the integrated device from FIGS. 2a–2i, in accordance with a preferred embodiment of the present invention.

Referring now to FIG. 3, there is illustrated a high-level process flow diagram of a method for manufacturing an integrated circuit device having a built-in thermoelectric cooling mechanism, in accordance with a preferred embodiment of the present invention. After active circuitry has been formed on the front side of a wafer, as shown in block 41, the wafer is turned upside down, as depicted in block 42. RIE etch is performed to remove backside films from the back side of the wafer, as illustrated in block 43. The photoresist layer is then removed from the front side of the wafer to expose the passivation layer in which active electric circuitry is resided, as shown in block 44. A barrier layer is separately deposited on the surface of the passivation layer and on the back side of the wafer, as depicted in block 45. The barrier layer can be a nitride layer or a diamond-like carbon layer.

Afterwards, a first conductive layer is formed by patterning and etching, as shown in block 46. A bismuth telluride layer is then deposited on top of the first conductive layer, as depicted in block 47. $N^{30}$ regions and $P^{30}$ regions are separately formed within the bismuth telluride layer via N-type ion implantations and P-type ion implantations, respectively, as illustrated in block 48. The $N^+$ regions and $P^{30}$ regions will become the alternating $N^{30}$ and P regions of Peltier devices.

A second conductive layer is then formed on top of the bismuth telluride layer by patterning and etching, as shown in block 49. Next, a passivation layer is deposited on top of the second conductive layer, as depicted in block 50. The barrier layer is removed from the front side of the wafer, as illustrated in block 51. At this point, the processing on the front side of the wafer, which includes wiring and passivation, is completed.

With the assistance of an appropriate photoresist layer, an RIE process can be preformed to construct connections to the first and second conductive layers, as shown in block 52. At this point, vias can be formed for allowing the first and second conductive layers of the Peltier devices to be electrically connected to a current source.

As has been described, the present invention provides an integrated circuit device having a built-in thermoelectric cooling mechanism.

While the invention has been particularly shown and described with reference to a preferred embodiment, it will be understood by those skilled in the art that various changes in form and detail may be made therein without departing from the spirit and scope of the invention.

What is claimed is:

1. A method for manufacturing a thermoelectric cooling mechanism for an integrated circuit, said method comprising:

forming a plurality of electric circuits on one side of a wafer; and forming a plurality of thermoelectric cooling devices on opposite side of said wafer by depositing a first conductive layer;

depositing a layer of Peltier material on top of said first conductive layer;

building a plurality of $N^{30}$ regions and P regions within said Peltier material layer; and depositing a second conductive layer on top of said Peltier material layer.

2. The method of claim 1, wherein said Peltier material layer is made of bismuth telluride.

3. The method of claim 1, wherein said Peltier material layer is made of lead telluride.

4. The method of claim 1, wherein said Peltier material layer is made of chalcogenide.

5. The method of claim 1, wherein said forming a plurality of $N^+$ regions and $P^+$ regions is performed by N-type ion implantations and P-type ion implantations, respectively.

6. The method of claim 1, wherein said method further includes forming a barrier layer between said first conductive layer and said wafer.

7. The method of claim 6, wherein said barrier layer is a nitride.

8. The method of claim 6, wherein said barrier layer is a diamond-like carbon.

* * * * *

UNITED STATES PATENT AND TRADEMARK OFFICE
CERTIFICATE OF CORRECTION

PATENT NO. : 6,645,786 B2
DATED : November 11, 2003
INVENTOR(S) : Pomerene et al.

It is certified that error appears in the above-identified patent and that said Letters Patent is hereby corrected as shown below:

<u>Column 4,</u>
Line 58, "a plurality of $N^{30}$ regions and P regions" should be -- a plurality of $N^+$ regions and $P^+$ regions --

Signed and Sealed this

Ninth Day of March, 2004

JON W. DUDAS
*Acting Director of the United States Patent and Trademark Office*